SUPERCONDUCTIVE IN-LINE GATING DEVICES AND CIRCUITS

Filed Aug. 23, 1961 4 Sheets-Sheet 1

INVENTORS
CHARLES J. BERTUCH
NORMAN H. MEYERS
BY John E. Dougherty Jr.
ATTORNEY

Aug. 18, 1964 C. J. BERTUCH ETAL 3,145,310

SUPERCONDUCTIVE IN-LINE GATING DEVICES AND CIRCUITS

Filed Aug. 23, 1961 4 Sheets-Sheet 4

3,145,310

SUPERCONDUCTIVE IN-LINE GATING DEVICES AND CIRCUITS

Charles J. Bertuch, Somerset, N.J., and Norman H. Meyers, Chappaqua, N.Y., assignors to International Business Machines Corporation, New York, N.Y., a corporation of New York Filed Aug. 23, 1961, Ser. No. 133,528
15 Claims. (Cl. 307—88.5)

The present invention relates to superconductive circuits and more particularly to improved superconducting gating devices of the in-line type and circuits using these devices.

Known superconductive gating devices include the wire wound cryotron, the crossed thin film cryotron, and the in-line cryotron. Each of these devices is formed of a gate conductor fabricated of a soft superconductive material and one or more control conductors fabricated of a hard superconductive material. The control conductor is energized to drive the gate conductor from a superconducting to a resistive state. The gate conductor of the wire wound cryotron is in the form of a wire, which may be hollow, and the control conductor in the form of a coil which is wound around the gate conductor wire. This type of device exhibits a relatively high inductance and low resistance and, therefore, a long time constant. Further, it is not susceptible to mass fabrication techniques. The crossed thin film cryotron includes planar thin film control and gate conductors with the control conductor being arranged at right angles to the gate conductor. Each of these conductors has a width appreciably greater than its thickness, and the width of the control conductor is made less than the width of the gate conductor to achieve current gain greater than unity. This device exhibits a lower inductance and a higher resistance than the wire wound device but is still somewhat limited in the resistance that can be achieved since, only the length of the gate conductor which is actually traversed by the control conductor is driven into a resistive state. Attempts to increase the resistance of crossed thin film cryotrons by decreasing the thickness of the gate conductor have met with some success but the advantages realized are limited by the fact that, as the gate conductor thickness approaches a penetration depth, it becomes more and more difficult to achieve operating gain. The inductive characteristics of both the wire wound cryotron and crossed film cryotron are improved by the use of superconductive shields. The same is true of in-line cryotrons, in which the gate conductor and the control conductor are also planar thin films which are laid down one above the other on a superconductive shield and extend parallel to each other. With this type of construction, it has been possible to achieve relatively high resistances without using extremely thin gate conductors. Further, by the use of control and gate conductors of equal width and using either a bias current applied to the control conductor or a separate biasing control conductor, operating gain greater than unity has been achieved. One disadvantage of in-line cryotrons has been, however, the inductive coupling which exists between the control and gate conductors of these devices. Though in the past some attempts have been made to eliminate inductive coupling between various superconducting circuits, no satisfactory superconducting in-line gating devices have been thus far developed which do not exhibit coupling between control and gate conductors.

The following patents, copending applications, and publications exemplify the present state of the art.

U.S. Patent No. 2,832,897, issued April 29, 1958 to D. A. Buck;

U.S. Patent No. 2,966,598, issued December 27, 1960 to J. B. Mackay;

Copending application Serial No. 625,512, filed on November 30, 1956 in behalf of R. L. Garwin;

Copending application Serial No. 761,085, filed on September 15, 1958 in behalf of R. L. Garwin;

Copending application Serial No. 809,818, filed on April 29, 1959 in behalf of J. J. Lentz et al.:

"Thin Film Catalog Memory" by A. E. Slade et al., Office of Naval Research Symposium Report, ACR-50, pp. 213–229.

In accordance with the principles of the present invention, superconducting gating devices are provided which are of the in-line type and in which inductive coupling between the control and gate conductors forming the device is eliminated without in any way detracting from the desirable characteristics of the in-line structure and in some cases even enhancing these characteristics. Generally, this desired result is achieved by constructing the in-line gating device control conductor of first and second control conductor sections and the gate conductor of first and second gate conductor sections. The first control conductor section is laid down above the first gate conductor section to form a first in-line cryotron. The second control conductor section is laid down above the second gate conductor section to form a second-in-line cryotron. The gate conductor sections are so connected and the control conductor sections are so connected that the relative directions of current flow in one of the in-line cryotrons is parallel and in the other is anti-parallel, that is, in one of the cryotrons, the control and gate conductor currents flow in the same direction (parallel), and in the other cryotron, control and gate conductor currents flow in opposite directions (anti-parallel). By designing each of the cryotrons to have the same length, and maintaining the thickness of the separating layers of insulating material uniform, the inductive coupling between the control and gate conductors of one cryotron exactly balances the inductive coupling between the control and gate conductors of the other cryotron. Further, since this bucking is achieved within the device itself, rather than at separated points in the circuit in which the device is connected, effectve elimination of inductive coupling is achieved at very high operating speeds.

As is illustrated in the embodiments of the invention disclosed herein by way of example, the control and gate conductor sections may be connected in either series or parallel and arranged either side by side or longitudinally extending one next to the other according to the application in which the device is to be employed. The control conductor sections are of the same width as the gate conductor sections in applications where operating gain is to be achieved; in such a case, one of the cryotrons includes a hard superconductive gate section and is actually a dummy cryotron whose gate never switches resistive. Where operating gain is not necessary, the gate conductors may be fabricated to both have a width less than that of the control conductors; in such a case, the operating characteristic of the in-line cryotrons operated in the parallel mode and the in-line cryotron operated in the anti-parallel mode have been found to be the same. Therefore, both gate sections of such a device are fabricated of soft superconductive material and selectively driven into a resistive state by signals applied to the control conductor. Such a device provides an unusually high resistance and is particularly useful in sensing applications and in driving long superconductve transmission lines. As is illustrated by the embodiments of the invention disclosed herein, various in-line cryotrons without inductive coupling having different detailed constructions may be included in the same superconductive circuit in order to utilize to the best advantage the attributes realized with each specific construction.

Therefore, it is an object of the present invention to provide improved superconductive gating devices and circuits using these gating devices.

It is a further object to provide improved in-line gating devices without inductive coupling between control and gate conductors.

It is still a further object to provide improved in-line gating devices without inductive coupling between the control and gate conductors which exhibit a very high resistance.

It is still another object to provide improved in-line gating devices exhibiting gain greater than unity, which include two in-line cryotrons, one operated in the parallel mode which is not switched, and the other operated in the anti-parallel mode, which is switched, wherein there is no net inductive coupling between control and gate conductors for the device.

It is a further object of this invention to provide an in-line gating device which includes one in-line cryotron operated in a parallel mode and a second in-line cryotron operated in an anti-parallel mode so that there is no net inductive coupling between control conductor and gate conductor sections of the device, and wherein the operating characteristics for the two cryotrons are the same and the gates of both are driven resistive under the control of signals applied to the control conductor.

Still another object of the present invention is to provide in-line gating devices which can be used in circuits operated at very high speeds without there being any net inductive coupling produced between control and gate conductors.

Still another object of the present invention is to provide improved high speed superconductive circuits using in-line gating devices wherein inductive coupling between control and gate is bucked out within the device itself in a space which is short compared to the wavelength of the highest frequency signal employed in the circuits.

The foregoing and other objects, features and advantages of the invention will be apparent from the following more particular description of preferred embodiments of the invention as illustrated in the accompanying drawings.

Figure 1:
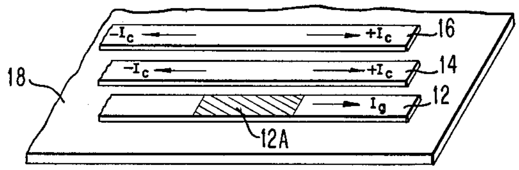
FIG. 1 is a somewhat diagrammatic showing of an in-line cryotron.

Referring now to the drawing in detail, FIG. 1 shows an in-line cryotron of the type found in the prior art. This cryotron includes a gate conductor strip 12, which includes a gate section 12A, and two control conductor strips 14 and 16. The gate and control conductor strips are laid down one above the other in parallel-spaced relationship over a superconductive shield 18. The conductors and the shield are insulated from each other by appropriate layers of insulating material not shown in the drawing. The gate section 12A is fabricated of a soft superconductive material, such as tin or indium, and the remaining portions of strip 12, as well as the control conductors 14 and 16 and the shield 18, are fabricated of a hard superconductive material such as lead.

In operating the in-line cryotron of FIG. 1, the gate section 12A is in a superconducting state in the absence of current signals in the control conductors 14 and 16. Signals are applied to one or both of the control conductors 14 and 16 to produce a magnetic field of sufficient intensity to drive the soft superconducting gate section 12A into a resistive state. The resistance thus introduced into the gate strip 12 may be used to provide a voltage indication, or to switch a current flowing in the gate strip into a superconducting path connected in parallel with this strip.

Each of the strips 12, 14 and 16 is fabricated to have a width very much greater than its thickness. Thickness dimensions are in the order of 10,000 angstroms or less and, as will be explained in some detail later, it is preferable that the thickness of the gate be appreciably greater than the penetration depth of the superconductive gate material at the operating temperature of the device. With this type of construction, that is with thin planar gate and control conductors and thin layers of insulating material separating these conductors, the operation of the device is essentially the same for signals applied to a single control conductor, or to two control conductors such as 14 and 16 arranged one above the other. Thus, in considering the characteristics of the devices which are about to be explained with reference to FIGS. 2 and 3, it should be remembered that the control conductor current as plotted in these figures may be indicative of the current applied to a single control conductor in a device including only one such control conductor, or may represent the net control current in an in-line cryotron having multiple control conductors.

Figure 2:
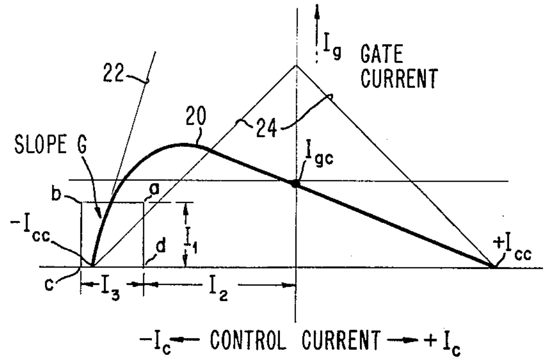
FIG. 2 shows the transition characteristic for an in-line cryotron in which the control and gate conductors have the same width.

FIG. 2 shows the transition or gain characteristic 20 for the gate conductor section 12A of the device of FIG. 1. Gate conductor current $I_g$ is plotted as the ordinate in this figure and net control conductor current $I_c$ as the abscissa. For values of gate and control current defining loci beneath the curve, the gate section 12A is superconducting and for values of gate and control conductor current defining loci above the curve, the gate section is resistive. The curve is plotted for gate conductor current $I_g$ in one direction as indicated in FIG. 1, and control conductor current $I_c$ either in the same direction, and plotted as positive in FIG. 2, or in an opposite direction in which case it is considered to be negative in the showing of FIG. 2. It is usual to refer to the operation of such devices as being parallel or anti-parallel, the term parallel indicating that the control and gate conductor currents are applied in the same direction and the term anti-parallel indicating that the control and gate conductor currents are applied in opposite directions. It should be noted that image currents of both $I_g$ and $I_c$ return in the shield plane 18 directly beneath strips 12, 14, and 16.

In the device of FIG. 1, the control and gate conductors have the same width and for this type of construction, as is evidenced in FIG. 2, the response of the device is significantly different for applied currents in the same direction than for applied currents in opposite directions. The value $I_{gc}$ in FIG. 2 represents the value of gate conductor current which is effective, in the absence of any current $I_c$ in the control conductor(s), to cause the gate conductor to assume a resistive state. The values $+I_{cc}$ and $-I_{cc}$ represent the critical current required in the control conductor(s) to drive the gate resistive in the absence of gate conductor current. As can be seen for the curve 20, the critical current which the gate conductor can carry and remain superconducting is actually raised by applying control conductor current in the opposite direction, that is, where the device is operated in the anti-parallel mode as mentioned above. When the applied control current is in the same direction as the gate current, the amount of current which the gate can carry and remain superconducting is, as indicated by the curve, appreciably reduced.

In one of the principal modes of operating in-line cryotrons of this type, two control conductors, such as are shown in FIG. 1, are employed. A bias current is continuously applied to one control conductor and control current signals are applied to the other to control the gate section between superconducting and resistive states. In many such circuits, the gate conductor is connected in series with the control conductor of a second device of the same type. For this mode of operation, it is necessary that the device exhibit gain, that is, that the signal which is required to be applied to the signal control conductor to cause the gate conductor to be driven resistive be less than the current which the gate conductor can carry and still remain in a superconducting state. Referring to FIGS. 1 and 2 and assuming that the bias conductor is the control conductor 14 and the signal conductor is the conductor 16, a current in the negative direction equivalent to the value $I_2$ shown in FIG. 2 is applied as the bias current to conductor 14. At the same time, a gate current, in the direction indicated in FIG. 1 and having a magnitude $I_1$ shown in FIG. 2, is applied to the gate conductor strip 12 in FIG. 1. With these currents being applied to the bias control conductor and gate conductor, the operating point is at point *a* in FIG. 2. This point *a* is in FIG. 2 between two dotted lines designated 22 and 24. Line 22 represents the slope of the extreme left-hand portion of operating characteristic 20 and line 24 is a 45° line having a slope of 1. In order to achieve operating gain, it is necessary that the slope of the left-hand portion of curve 20, as represented by the line 22, be greater than unity and that the operating point *a*, with bias and gate current applied, be to the left of line 24 which has a slope of 1.

When it is desired to drive the gate conductor section 12A of FIG. 1 into a resistive state, a signal equal in magnitude to the current $I_3$ shown in FIG. 2 is applied to the signal control conductor 16 of FIG. 1. With this signal applied, the operating point is at point *b* and the gate conductor section 12A is resistive. If the gate conductor strip is connected in parallel with a further superconducting strip and the current $I_1$ is then transferred out of strip 12A, the operating point is at point *c* in which case the gate remains resistive. Thereafter, after the current shifting has been accomplished, the signal $I_3$ applied to signal control conductor 26 is removed, the gate reassumes a superconducting state at point *d* with no current flowing into the gate conductor section. The device reassumes its initial state at point *a* when the current $I_1$ is switched back into the gate conductor strip 12. The operation depicted by the square *abcd* is the usual case where the control and gate conductors of different in-line cryotrons are connected in series with each other with one such device driving the other. In such a case, the control conductor current for one device is equal to the gate conductor current for another device and thus the currents $I_1$ and $I_3$ are equal. The actual operating gain in such a circuit is unity but, as is evident, in the showing of FIG. 2, it is possible to drive the gate conductor section 12A from a superconducting to a resistive state with an applied signal having a magnitude less than $I_3$, in which case an operating gain greater than unity is achieved.

Figure 3:
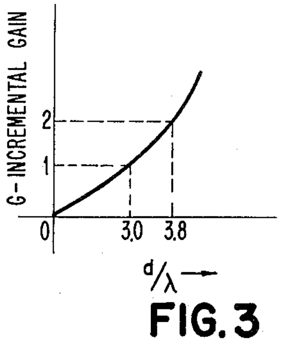
FIG. 3 is a plot depicting the relationship between the incremental gain of in-line cryotrons and the ratio of thickness of the gate conductor of the cryotron to the penetration depth of the material of which it is constructed.

It is, of course, not always necessary to achieve operating gain greater than unity and other modes of operation of in-line cryotrons may be realized using, for example, a single control conductor which is energized with a sufficiently large current signal to drive the gate conductor resistive. The signal applied to the control conductor is then greater than the current carried by the gate conductor.

Where gain is realized in in-line cryotrons, it is only realized as the result of the utilization of a bias current in conjunction with the control signals. This is only possible for a device exhibiting an operating characteristic with a slope greater than unity as indicated in FIG. 2. For this to be achieved, it is necessary that the thickness of the gate section 12A of the in-line cryotron be greater than the penetration depth of the material of which it is constructed at the operating temperature. The relationship between the ratio of the thickness of the gate section 12A and its penetration depth $\lambda$ at the operating temperature, and the incremental gain of the in-line cryotron G, which is the slope of the left-hand portion of the curve 20 in FIG. 2, is plotted in FIG. 3. For the cryotron material whose characteristics are plotted in FIG. 3, a ratio of gate conductor thickness to penetration depth of 3.0 is required to produce an incremental gain G of 1, that is, a characteristic wherein the slope of the left-hand portion of the curve is exactly equal to the slope of the line 24 in FIG. 2. As a ratio of the thickness to penetration depth is increased, as is indicated in FIG. 3, higher incremental gains are achieved.

Figures 4, 5:
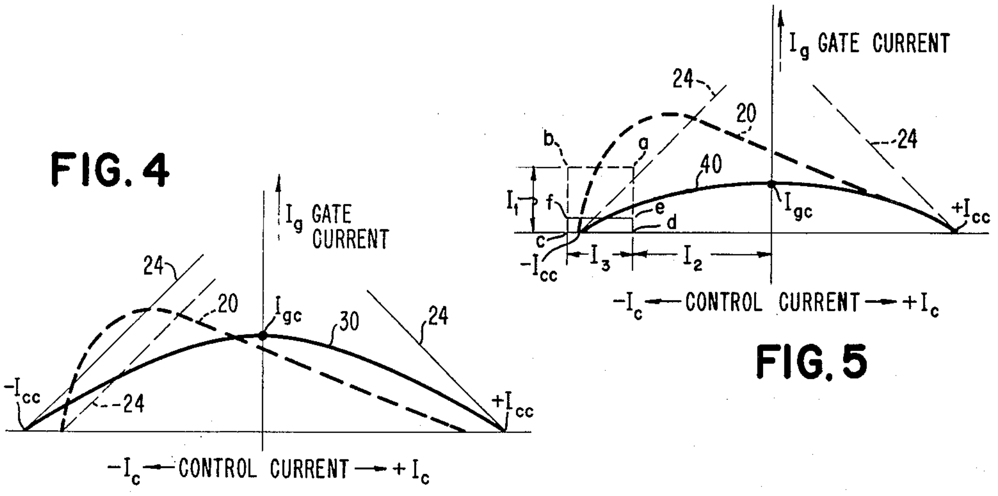
FIGS. 4 and 5 are plots showing the characteristics of in-line cryotrons having control conductors wider than their gate conductors.

FIGS. 4 and 5 are plots of the characteristics of in-line cryotrons of the type shown in FIG. 1 wherein the width of the control conductor(s) is greater than the width of the gate conductor. In each of these figures, the curve 20 of FIG. 2, which is the characteristic for control and gate conductors of the same width, is represented in dotted fashion. In FIG. 4 the full line curve 30 is representative of the characteristic of an in-line cryotron having a gate conductor which is the same width as that whose characteristic is represented by the curve 20 and having a control conductor of greater width. Since the gate conductors for the curves 20 and 30 have the same width (and thickness), the critical self-current $I_{gc}$, of each of the devices would be expected to be the same. However, the wider control conductor produces an effect similar to that of a second shield; therefore, the critical gate current $I_{gc}$ of the device of curve 30 is somewhat higher. Since the control conductor for the device having the full line characteristic curve 30 is wider than that for the device whose characteristic is depicted by the dotted curve 20, the current required in the wider control conductor to drive its associated gate conductor resistive is greater than that required in the narrower control conductor. Thus, the points at which the curve 30 intercepts both the ordinate ($I_{gc}$) and the abscissa ($I_{cc}$) of FIG. 4 are farther removed from the origin than the intercepts for the dotted curve 20. A further and more significant difference between the curves 20 and 30 of FIG. 4 is that the latter curve is symmetrical with respect to the ordinate axis. The response of the in-line cryotron with the control conductor wider than the gate conductor is the same regardless of the direction of control and gate conductor currents. Further, both extreme portions of the characteristic curve 30 have a slope less than 1 and, therefore, the device exhibiting this characteristic cannot be operated even with bias to have an operating gain equal to or greater than 1.

Referring now to FIG. 5, the curve 40 of this figure also represents an in-line cryotron having a control conductor which is wider than its gate conductor. The relationship of the curve 40 to the curve 20, which represents a device having control and gate conductors of equal width, is different than the relationship between the curves 30 and 20 of FIG. 4 since the device of curve 40 of FIG. 5 has a control conductor of the same width as that of the curve 20 but has a narrower gate conductor. Thus, as is indicated, both of the curves 20 and 40 intercept the abscissa at the same point whereas the curve 40, which represents the device having the narrower gate conductor, has a lower value of critical gate current $I_{gc}$. As is indicated by the line 24 and the slope of curve 40 at both extremities, a gating device exhibiting this characteristic cannot be operated, even with bias, to achieve operating gain greater than unity.

Figure 7:
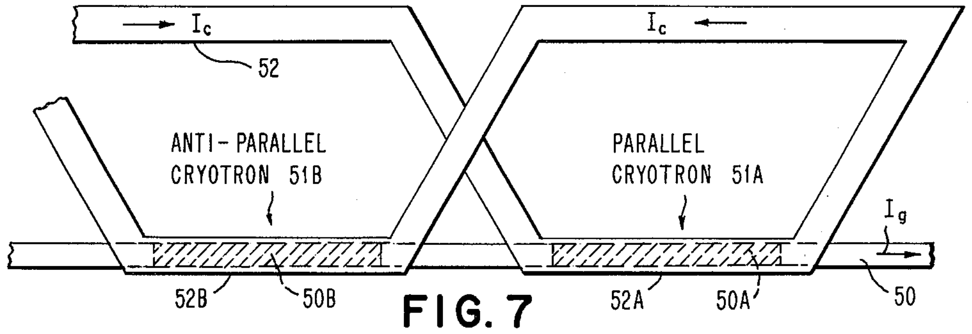
FIGS. 7, 8, 9, 10, 11 and 12 show embodiments of in-line gating devices constructed in accordance with the principles of the present invention, each of which includes two in-line cryotrons and has no net inductive coupling between control and gate conductors.

FIG. 7 is a showing of an in-line cryotron gating device constructed in accordance with the principles of the present invention. This device exhibits all of the attributes of in-line cryotrons in general, but it does not have any inductive coupling between the control and gate conductors. In the somewhat diagrammatic showing of FIG. 7, only the control and gate conductors themselves are shown, the shield and layers of insulating material which are used in fabricating the actual device being omitted to avoid overcomplicating the drawing. A conductor strip 50 is the gate conductor, and a conductor strip 52 is the control conductor. Strip 52 includes two sections 52A and 52B which are arranged above corresponding sections 50A and 50B of the gate strip 50. Control conductor sections 52A and 52B form, with gate conductor sections 50A and 50B, respectively, two in-line cryotrons. As is illustrated by the shading in the figure, both gate sections 50A and 50B are fabricated of soft superconductive material while the remaining portions of gate conductor 50 and the entire control conductor 52 are fabricated of hard superconductive material. Gate sections 50A and 50B are narrower than control conductor sections 52A and 52B and, therefore, the two cryotrons have symmetrical characteristics of the type represented by curves 30 and 40 in FIGS. 4 and 5. The response of the soft superconductive material in the gate section 50A or 50B is dependent only on the magnitude of current signals carried by it and the adjacent control section and is in no way dependent upon the relative directions of current flowing in these two elements of the switching device.

If the current in the gate conductor 50 flows in the direction indicated by the arrow $I_g$ shown in FIG. 7 and the control conductor current in the direction indicated by the arrow $I_c$, it can be seen that the current flowing in control conductor section 52A is in the same direction as in gate conductor section 50A immediately beneath it, whereas the current flowing in the control conductor section 52B is in an opposite direction to the current flowing in the gate conductor 50B. Thus, one of the cryotrons 51A is operated in a parallel mode and the other, 51B, in an anti-parallel mode. However, since as noted above, the response of the devices with the control conductor sections wider than the gate conductor sections is not dependent upon relative directions of current flow, the gate conductor sections 50A and 50B are controlled in exactly the same manner, both being driven resistive at the same time and both becoming superconducting at the same time. Moreover, and extremely important, the relative direction of current flow between the sections 50A and 52A is just the opposite to that between the sections 50B and 52B, so that there is exact balancing of any inductive coupling produced by each of these cryotrons and the net inductive coupling between the control conductor 52 and the gate conductor 50 is zero. Further, it should be stressed that this inductive coupling between the control and gate conductors is reduced to zero within the gating device itself. The two sections 50A and 50B are adjacent sections of gate conductor 50 and the two control sections 52A and 52B are adjacent sections of a control conductor 52. This is an extremely important consideration since, if all of the possible deleterious effects of inductive coupling between control and gate conductors are to be eliminated, it is necessary that the cancelling of the inductive coupling be produced within a space in the circuit which is shorter than the wave length of the highest frequency signal which is to be accommodated. This is best achieved by building the inductive cancelling into the gating device itself as is illustrated in the embodiments of the invention herein disclosed.

Figure 8:
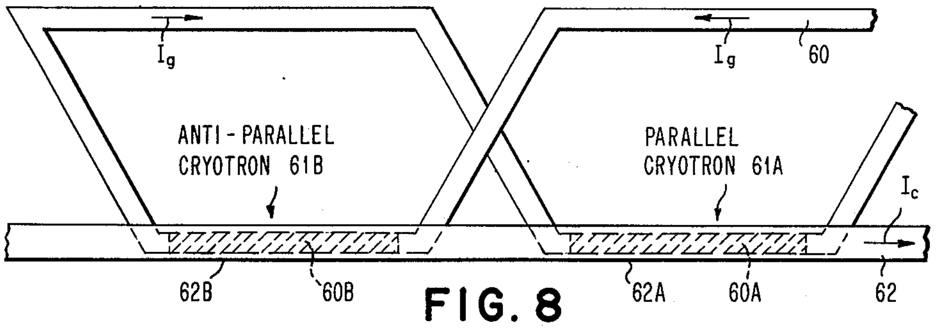

The embodiment shown in FIG. 8 is similar in most respects to that of FIG. 7, differing only in that the gate conductor, which is designated 60 in FIG. 8, is formed in figure 8 fashion and the control conductor 62 of FIG. 8 is arranged in a straight line. In all other respects, the gating devices of FIGS. 7 and 8 are functionally the same. There is no inductive coupling between the control and gate conductors and there are two gate conductor sections in each embodiment which are driven resistive under the control of signals applied to the control conductors. The difference in the embodiments of the two figures is that in the embodiment of FIG. 7, the control conductor 52 is the longer conductor and exhibits higher inductance, whereas, in the embodiment of FIG. 8, gate conductor 60 is longer than control conductor 62 and exhibits higher inductance.

Particular note should be made of the fact in the embodiments of FIGS. 7 and 8, that each of the points at which there is coupling between the control conductor strip and the gate conductor strip is actually an in-line cryotron. More specifically, the gating device of FIG. 7 has two gate conductor sections 50A and 50B which are driven resistive and the gating device of FIG. 8 has two gate conductor sections 60A and 60B which are driven resistive. The overall resistance of each of these in-line gating devices, with the inductive coupling between control and gate eliminated, is higher than that achieved by a single in-line cryotron of usual geometry. This increased resistance is of extreme importance in many applications and, though the gating devices of FIGS. 7 and 8 do not exhibit gain greater than unity, they may be used to advantage as sense cryotrons for producing output voltages indicative of the presence of current in a line, or as driving cryotrons used to apply signals to long superconducting transmission lines.

Where a device such as that shown in FIG. 7 or FIG. 8 is to be used as a cryotron for sensing the presence or absence of current in a superconducting line in which the control conductor for the device is connected, current is applied to the gate conductor for the device and the output is in the form of a voltage developed across the gate conductor when the associated control conductor is energized. In this mode of operation, it is desirable to obtain as large a voltage indication as possible. However, where the sense current applied to the gate conductors is current continuously applied, care must be taken to avoid heat latching of the gate conductor. By heat latching is meant that characteristic of superconductive gate conductors which causes them, when once driven resistive by an applied field while carrying an appreciable D.C. gate current, to remain latched in a resistive state after the applied field is removed so long as D.C. gate current continues to flow.

Figure 6:
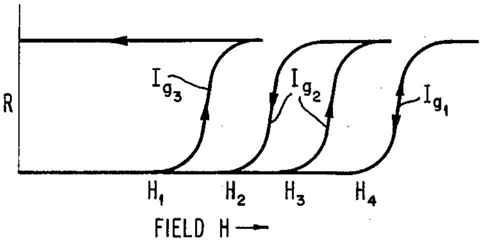
FIG. 6 is a plot indicating the field-induced transition characteristics of superconductive gate conductors in certain modes of operation.

Characteristic curves indicative of the heat latching phenomenon are shown in FIG. 6 in which the resistance R of a gate conductor is plotted against the field H applied to the gate conductor for three different values of gate current in the gate conductor. The three values of gate current are designated $I_{g1}$, $I_{g2}$, $I_{g3}$; the current $I_{g1}$ is less than the current $I_{g2}$ which current is, in turn, less than the current $I_{g3}$. As is shown in the drawing, with the larger current $I_{g3}$ flowing, a smaller applied field $H_1$ is required to drive the gate resistive. When this applied field is removed, the gate conductor carrying the current $I_{g3}$ remains resistive until the current is removed entirely from the gate conductor. This is due to the fact that once the gate conductor is driven resistive, the current in the gate conductor produces $I^2R$ heating to increase the temperature of the gate conductor to a point at which the current $I_{g3}$ is sufficient to maintain it resistive. With a smaller value of current $I_{g2}$ flowing in the gate conductor, it can be seen that a somewhat larger applied field $H_3$ is required to drive the gate conductor resistive. However, as the intensity of the applied field is reduced to the value $H_3$, the gate does not become superconducting while carrying the current $I_{g2}$, but remains resistive until the intensity of the applied field is reduced below the value $H_2$. In this case, the heating of the gate produces hysteresis in the transition between superconducting and resistive states. When the gate current is $I_{g1}$, smaller than the currents $I_{g2}$ and $I_{g3}$, a larger applied field $H_4$ is required to drive the gate resistive but here there is not sufficient heating to introduce any appreciable hysteresis in the transition characteristic for the gate and, therefore, it undergoes a transition from the superconducting to the resistive state and then back from the resistive to the superconducting state at the same value of applied field.

When an in-line gating device of the type shown in FIGS. 7 and 8 is employed, as an output gate, the amount of temperature change which can be tolerated without heat latching is precisely determined by the amplitude of control current signal available to drive the sense cryotron around its hysteresis loop. The maximum tolerable temperature rise is here designated $\Delta T$. This parameter as well as the thermal characteristics of the gate itself in the environment, here designated by a constant K, limit the power P which may be dissipated in the cryotron when in operation without making the thermal hysteresis loop larger than the available control current signal. The power which is dissipated by the gate is also equal to $V^2/R$ that is to the ratio of the square of the voltage developed across the gate to the resistance of the gate itself. From these relationships it follows that:

$$\text{Allowable Power} = \frac{V_g^2}{R_g} = K\Delta T$$

which equation can be rewritten as follows:

$$V_g^2 = K\Delta T R_g$$

From this last equation, it can be seen that higher voltage signals can be achieved and heat latching avoided by increasing gate conductor resistance; whereas attempts to achieve higher voltage signals by increasing gate conductor current produces heat latching. Referring to the characteristics of FIGS. 4 and 5, it is preferable, for this type application, that the gate conductor be as narrow as possible to achieve, for example, a characteristic such as that shown at 40 in FIG. 5. Considering gating devices of the type shown in FIGS. 7 and 8, the gate conductors are here narrower than the control conductors thus making them ideal for providing high resistance outputs. This attribute is enhanced by the fact that in each of these devices, two narrow gate conductor sections are driven resistive under control of the signals applied to the control conductor.

Figure 9:
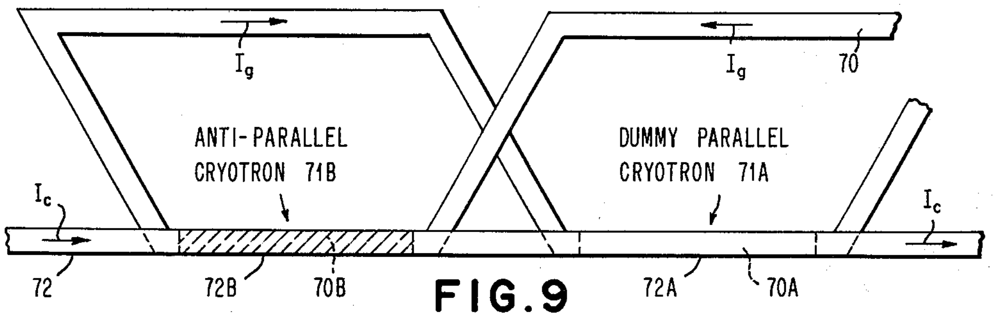

The embodiment of FIG. 9 has the same geometrical layout as that of FIG. 8 and differs from the embodiment of FIG. 8 in that the gate conductor sections have the same width as the control conductor sections. The device includes two cryotrons 71A and 71B. Cryotron 71B is formed by control conductor section 72B and gate conductor section 70B in which currents flow in opposite directions and this cryotron is, therefore, operated in the anti-parallel mode. The other cryotron 71A is formed by the gate conductor section 70A and the control conductor section 72A. In this cryotron, the control and gate currents flow in the same direction and the operation is in the parallel mode. Since the control and gate conductor sections of the two cryotrons have the same width, the characteristic for the anti-parallel cryotron 71B is different from that of the parallel cryotron 71A. For this reason, in the embodiment of FIG. 9 only the gate conductor section 70B of anti-parallel cryotron 71B is made of soft superconductive material; the gate conductor section 70A is fabricated of a hard superconductive material as are the remaining portions of the device. With this type of construction, the parallel cryotron 71A, formed by hard superconductive control and gate sections 72A and 70A, is actually a dummy cryotron, and no resistance is introduced into the gate section of this cryotron when the device is operated. The only function of the dummy cryotron is to balance out the inductive coupling between the control and gate conductors of the device. Note should be made of the fact that in this, as well as the other embodiments, this inductive bucking is accomplished in the device itself in the shortest possible space, thereby allowing for operation of the device with complete cancellation of the inductive signals in very high speed circuits.

The operating characteristics of the device of FIG. 9 are determined solely by the characteristics of the anti-parallel cryotron 71B and, therefore, the transition characteristic of the device is represented by that portion of the curve 20 in FIG. 2 which is to the left of the ordinate axis. The device can be operated to exhibit gain in the same manner as has been previously explained for the devices of FIG. 1. A bias current is continuously applied to control conductor 72 or to a second separate bias control conductor; switching signals are applied to control conductor 72 in the presence of this bias current.

Figure 10:
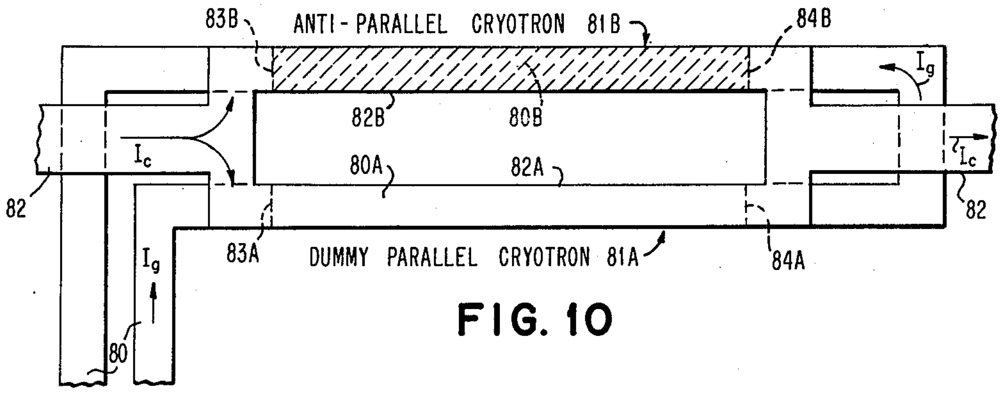

A further embodiment of the invention is shown in FIG. 10 which is similar to the embodiment of FIG. 9 in that one of the two cryotrons forming the device is a dummy cryotron. This cryotron, designated 81A, is operated in the parallel mode and the other cryotron 81B, which is the operating cryotron is operated in the anti-parallel mode. In the embodiment of FIG. 10, the gate conductor is designated 80 and includes a hard superconductive dummy gate conductor section 80A which is connected in series with the actual soft superconductive gate conductor section 80B. Current flows in these two series connected gate conductor sections as indicated by the arrow $I_g$. The control conductor section 82 includes two parallel sections 82A and 82B and the current $I_c$ applied to this control conductor 82 splits between these two sections. The design is such that the two parallel sections have equal inductance so that the applied current divides equally between these two sections which are entirely superconducting. With the control conductor current $I_c$ flowing in the direction indicated in control section 82B and gate conductor current $I_g$ in the opposite direction in gate section 80B, the cryotron 81B is operated in the anti-parallel mode and, therefore, may be operated with either a bias on the control conductor 82 or on a separate biasing control conductor to exhibit current gain. There is no inductive coupling between the control conductor 82 and gate conductor 80 of the overall device since the coupling of one cryotron of the device cancels out that of the other cryotron.

It is, of course, apparent that in operating the device of FIG. 10, only half of the actual control conductor current supplied is directed through the operating control conductor section 82B of the anti-parallel cryotron 81B. For this reason, it is more difficult to achieve gain with this type of device than with the type of device shown in FIG. 9. For example, referring to the characteristics of FIG. 2, gain can be achieved in the device of the type shown in FIG. 10 wherein the operating point is somewhat to the left of the point *a* as shown in this figure. A bias current greater than $I_2$ is applied either to the single control conductor or a biasing control conductor for the device, so that the operating point is just to the right of the extreme left-hand portion of the operating characteristic 20. When biased at such a point, an extremely small signal can be utilized to switch the gate conductor 82B of FIG. 10 into the resistive state and this signal can be less than one-half the current value $I_1$ in FIG. 2, which current the gate is capable of carrying withuot being driven resistive. Thus, overall gain is achieved in that the signal required to be applied to the control conductor 82 to cause switching of the gate conductor 80 need not be greater than the current which the gate 80 is carrying.

Though with the parallel control conductor construction of FIG. 10, operating gain is more difficult to achieve, the inductance of the control conductor with the control conductor sections connected in parallel is lower than for devices of the type shown in FIGS. 7, 8 and 9 in which the two control conductor sections are series connected.

Another advantage of the device of FIG. 10 over those described above stems from the fact that the two cryotrons 81A and 81B, which provide the cancelling inductive effects, are arranged side by side rather than one next to the other. More specifically, in the devices of FIGS. 7, 8 and 9, the two cryotron sections are arranged along the longitudinal axis of the device one next to the other, whereas, in the device of FIG. 10, the two cryotrons are arranged side by side. In the actual construction of the device of this type, the length dimension of the overall device is much greater than the width dimension. In order to achieve perfect inductive bucking, it is necessary not only that the length of the cryotron, gate and control conductors for the parallel and anti-parallel sections be the same but also that the thickness of the insulating material separating the adjacent elements from each other and from the shield be the same. In fabricating a device such as that shown in FIG. 10, it is possible to achieve this result even though there is some change in the thickness of the insulating material along the longitudinal axis, as long as the thickness of the insulating material across the width of the device is the same. Since the width dimension is by far the smaller dimension of the device, it is easier to fabricate such a device and maintain the insulating thickness uniform across the much smaller width dimension of the device, it is easier to fabricate such a device and maintain the insulating thickness uniform across the much smaller width dimension than it is to maintain the thickness uniform along the entire length of the device.

It should be noted that in the showing of FIG. 10, the soft superconductive section 80B does not extend out from under the associated control conductor section 82B, but rather is terminated at points 83B and 84B so as not to be exposed to the field produced at the bend in the control conductor. In evaporating this type of device, an overlap type of construction of soft and hard superconductive material is necessarily produced at junction points 83B and 84B. In order to provide uniform coupling in both sections of the device, a similar overlap of the hard superconductive material of dummy gate section 80A is provided at points 83A and 84A. Similar overlaps are provided in the device of FIG. 9 which also includes a dummy cryotron. In the embodiment of FIGS. 7 and 8 in which both gate sections are soft superconductors, the overlapping is necessarily provided in both cryotrons using normal evaporation procedures.

Figure 11:
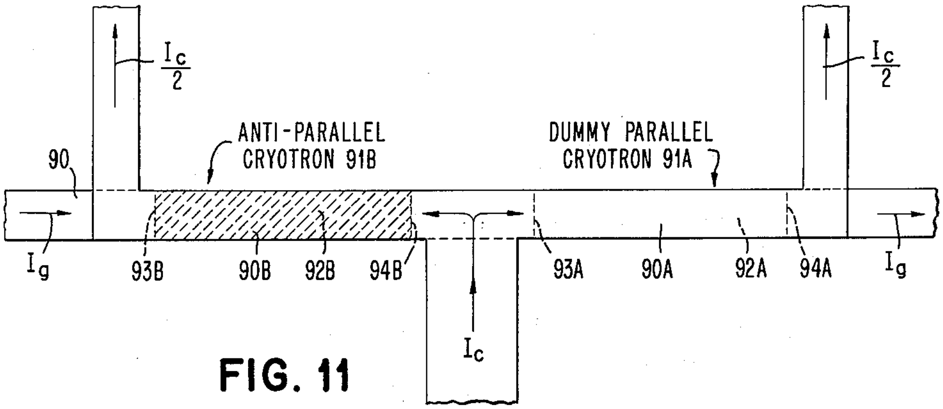

The gating device of FIG. 11, like that of FIG. 10, also includes an operating anti-parallel cryotron 91B and a dummy parallel cryotron 91A. These cryotrons are formed of two gate sections 90A and 90B of a gate conductor 90 which are connected in series, and two control sections 92A and 92B of a control conductor 92 which are connected in parallel. Functionally, the gating device of FIG. 11 operates in the same manner as that of FIG. 10. The device of FIG. 11, however, has a shorter gate conductor which exhibits a lower inductance; but this advantage is realized at the expense of arranging these two cryotrons along the longitudinal axis of this device thereby making it somewhat more difficult to fabricate.

Figure 12:
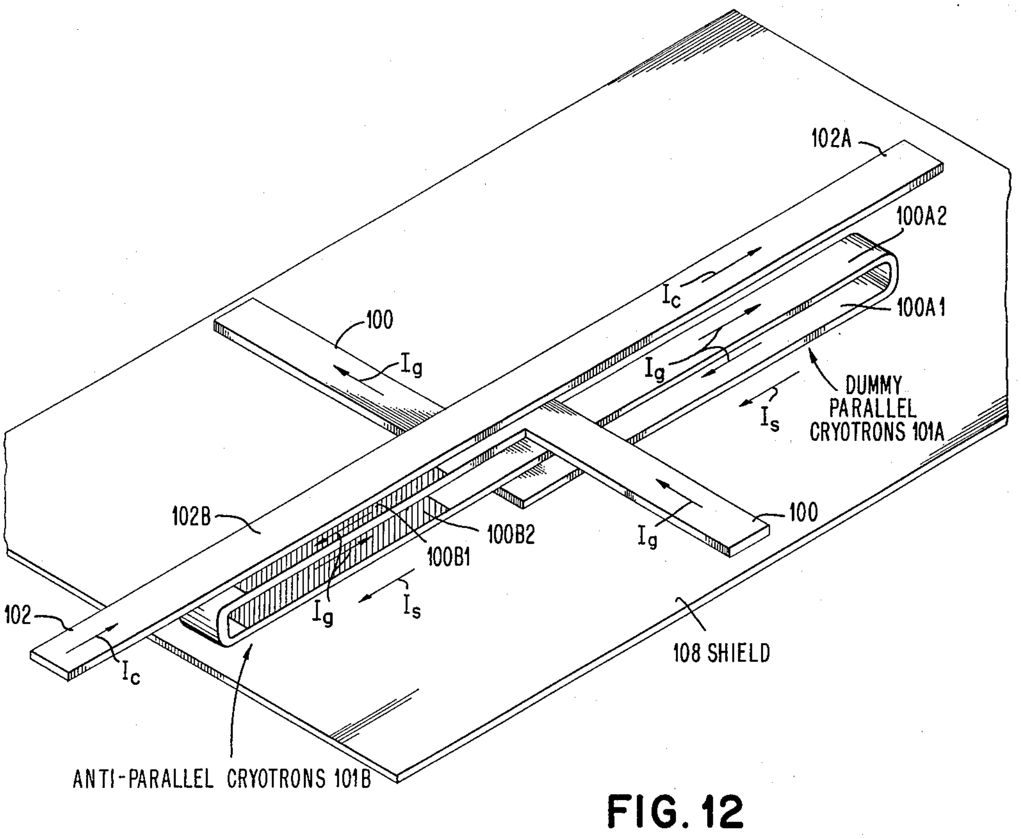

In the embodiment of the invention shown in FIG. 12, the gate conductor sections are series connected and the control conductor sections are series connected; further, both the gate and control conductors exhibit relatively low inductances. The control conductor, designated 102, is in the form of a single longitudinally extending strip which carries a control conductor current $I_c$ in the direction indicated. The gate conductor 100 is formed in a somewhat bifilar fashion and includes four sections which are designated 100A1, 100A2, 100B1 and 100B2. The gate current $I_g$ flows through the gate sections 100B1, 100B2, 100A2 and 100A1 in series. The device of FIG. 12 can be considered to include two dummy parallel cryotrons 101A and two actual anti-parallel cryotrons 101B. The first of these anti-parallel cryotrons is formed by control section 102B and gate section 100B1, and currents in these two conductors flow in opposite directions. Gate section 100B1 is formed of a soft superconductive material. A second anti-parallel cryotron is formed by the other gate section 100B2 and that portion of the shield 108 which is immediately beneath gate section 100B2. This portion of the shield carries a shield current $I_s$ which is actually an image current of current $I_c$ flowing in the control conductor section 102B. With constructions of the type shown, wherein the width of each of the conductors is appreciably greater than its thickness and the spacing between the conductors is very small, the current $I_s$ in the shield is essentially equal to the current $I_c$ in the control conductor. Thus, the gate section 100B2 is also fabricated of soft superconductive material and two gate sections 100B1 and 100B2 are driven resistive under control of the signals applied to the control conductor 102 which produces current $I_c$ in control conductor section 102B and image current $I_s$ in shield 108.

A similar pair of cryotrons is formed in the other side of the structure, one by the control conductor section 102A and the adjacent gate conductor section 100A2 and the second by the gate conductor section 100A1 and the adjacent portion of shield 108. However, for these two cryotrons, the current flow in gate and control conductor is in the same direction and, therefore, the gate sections 100A1 and 100A2 are fabricated of a hard superconductive material.

The device of FIG. 12 is advantageous in that it provides a relatively high resistance since there are two gate sections which are driven into a resistive state. The device exhibits a relatively low inductance since the control conductor 102 is relatively short, and the gate conductor is fabricated in bifilar fashion. At the same time, all of the advantages of in-line cryotrons are realized without there being any inductive coupling between control and gate conductors.

It is, of course, apparent that a structure similar to that shown in the embodiment of FIG. 12 can be fabricated with the gate conductor made narrower than the control conductor in which case, as described above, the operating characteristics are the same for parallel and anti-parallel operation. As a result, with this type of construction, all of the four gate sections may be made of soft superconductive materials and a very high resistance may be introduced into the gate section under the control of signals applied to the control conductor; with such a structure, however, gain may not be achieved even with the use of bias.

Figure 13:
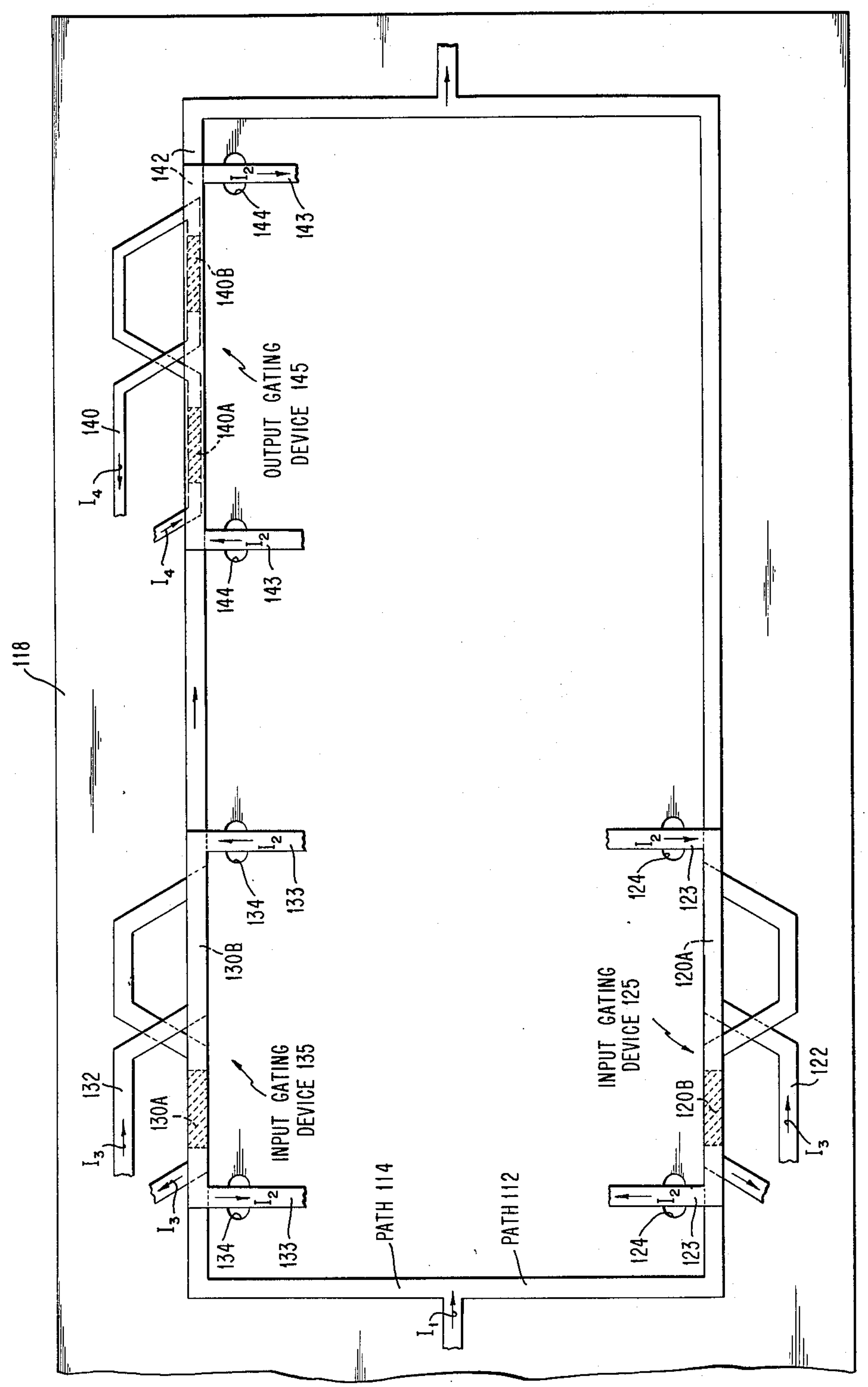
FIG. 13 is a somewhat schematic showing of an improved superconductive circuit employing to advantage in-line gating devices in accordance with the principles of the subject invention.

FIG. 13 shows a typical superconductive switch which employs gating devices constructed in accordance with the principles of the subject invention. This circuit is a conventional bistable superconductive circuit including two superconductive paths 112 and 114 which are connected in parallel across a current source that supplies a current $I_1$. Two input gates 125 and 135 are provided to selectively switch the current $I_1$ into one or the other of the paths 112 or 114 and thereby switch the circuit between its two stable states. A single output gating device 145 is provided to produce an output indicative of the particular state which the circuit is in.

Each of the input gating devices 125 and 135 is constructed in the manner shown in FIG. 9 above except that the roles of gate and control are interchanged. Gating device 125 includes a control conductor 122 and two gate conductor sections 120A and 120B which are connected in path 112. The gate conductor section 120B is formed of a soft superconductive material and is driven resistive to provide the gating function of the device, whereas, the gating section 120A is part of a dummy cryotron provided to eliminate inductive coupling between the control conductor 122 and path 112.

Since it is desired to operate the input gate 125 to exhibit gain, a bias current $I_2$ is supplied by a bias conductor 123 which is arranged to extend parallel to the section of path 112 that includes the gate sections 120A and 120B. Adjacent the gate section 120B which is driven resistive, both the control current $I_3$ and bias current $I_2$ flow in a direction opposite to the direction of gate current in path 112. The operating characteristics of the gate 120B of the input device 125 are depicted in FIG. 2 by the square *abcd*. The arrow $I_2$ represents the bias current applied to conductor 123; the arrow $I_3$ represents the control conductor signal applied to conductor 122; and the arrow $I_1$ represents the current in path 112 carried by the gate conductor section 120B.

There is no coupling between the control conductor 122 of gating device 125 and the loop formed by paths 112 and 114, of which the gate conductor sections 120A and 120B form a part. Since the bias conductor 123 continuously receives its bias current $I_2$, there is no need here to eliminate inductive coupling between this conductor and path 112. To eliminate the possibility of coupling signals inductively from path 112 into the bias conductor 123 which signals might be propagated along the bias conductor to another device being biased by this same circuit, openings 124 are provided in the shield 118 on which the entire circuit is laid down to provide high inductance chokes in this line 123 which prevent the passage of high frequency signals.

Where, instead of being continuously biased, the input gate is to be operated by the coincident application of selectively applied signals to two control conductors, the second control conductor is arranged to have the same configuration as the control conductor 122. For this construction, there is no inductive coupling between either of the control conductors and the gate which is connected in one path of the bistable loop circuit.

The other input gating device 135 has an identical construction to that of gating device 125. When it is desired to switch the circuit into a stable state with the current in path 112, the control conductor 132 is energized to introduce resistance into gate conductor section 130A. When it is desired to switch the circuit back into a stable state with current $I_1$ in path 114, the control conductor section 122 is energized with a signal $I_3$ to introduce resistance into gate section 120B.

Only a single output gate 145 is provided in the circuit of FIG. 13. Construction of this gate is similar to the gate shown in FIG. 8. The gate includes two gate sections 140A and 140B which are connected in series in a gate conductor 140. Both of the gate sections 140A and 140B are narrower than the associated control sections which are formed by path 114. A biasing conductor 143 is provided which is arranged in parallel to the portion of path 114 which forms the control conductor sections for output gate 145. The current in path 114 and the bias current in conductor 143 flow in the same direction adjacent gate setcion 140A. These two currents and the gate current flow in the same direction to provide a cryotron operated in the parallel mode, whereas, the gate current is opposite to the bias and control currents adjacent gate section 140B to provide a cryotron operated in the anti-parallel mode. The operating characteristics for such cryotrons, however, as is indicated by the curve 40 in FIG. 5, is symmetrical. Thus, both of the gate sections 140A and 140B are fabricated of soft superconductive material and output gate 145 produces a relatively high resistance when driven into a resistive state by current flowing in path 114.

The operating characteristics for output gating device 145 are designated by the rectangle *defc* in FIG. 5. The point *e* represents the condition of the device when a small sensing current, represented by the length of the line *de*, flows in the gate conductor 140. This current is kept small in order to avoid heat latching problems of the type described above with reference to FIG. 6. When the operating point of the device is at point *e* in FIG. 5, gate sections 140A and 140B are superconductive, there is no current flowing in path 114, and the bias conductor 143 is carrying a current $I_2$. When current is switched into path 114 by energizing control conductor 122 for input gate 125, path 114 carries the current $I_1$ and, therefore, the control conductor sections for output gate 145 are energized with this current. The operating point is now switched to point *f* and the gate sections 140A and 140B are driven resistive so that a voltage is developed across gate conductor 140 to provide an indication that the circuit of FIG. 13 is in the stable state with current in path 114. When this circuit is in its other stable state with current in path 112, there is no voltage developed across gate conductor 140.

Openings 124, 134 and 144 in the shield 118 beneath sections of the bias conductors 123, 133 and 143 prevent the coupling of signals from the paths 112 and 114 along the various bias conductors. It should also be pointed out that the D.C. current in the bias conductors provides a flux which links the loop formed by paths 112 and 114, and before any resistance is introduced into this loop, a circulating current is produced by transformer action between the bias conductors and the loop. However, once resistance is introduced into any section of the loop, the circulating currents are quenched and no such currents are again produced as long as the bias current continues to flow with the same magnitude. It is, of course, apparent that the bias conductors 123, 133 and 143, which carry the same current, may be connected together and receive their current from the same current source.

It has been pointed out above, that in order to provide in-line cryotron circuits wherein inductive coupling between control and gate is completely eliminated, the bucking must be accomplished in a space which is small compared to the wavelength of the highest frequency signals which the circuit is to accommodate. Typically, in a circuit such as is shown in FIG. 13, the gating devices within which the inductive cancelling is accomplished have a length of less than four centimeters, in which case, the circuit can be operated at speeds approaching the kilomegacycle range before there are any appreciable inductively coupled signals produced between control and gate conductors which are not effectively cancelled within the gating devices themselves.

Thus, it can be seen that the advantages of in-line cryotrons, such as, for example, high and controllable resistance achieved with gates having thicknesses greater than their penetration depth, can be realized in high speed superconductive circuits and, at the same time, the inductive coupling between the control and gate circuits can be completely eliminated. Gating devices including two cryotrons, one operated in the parallel mode and the other operated in the anti-parallel mode, such as are shown in the embodiments described in detail above, find many applications in cryogenic circuits wherein high resistance gates are required in order to provide high speed operation. One such circuit is indicated in FIG. 13. In-line cryotrons of this type are also employed to advantage in transmission line circuits of the type shown and described in Patent No. 2,962,681, issued November 29, 1960.

It should also be pointed out that, though the construction of each of the embodiments disclosed herein, with the exception of the embodiment shown in FIG. 12, is completely monofilar, the advantages of the invention may be also realized with bifilar devices such as are shown and disclosed in copending application Serial No. 824,120, filed June 30, 1959, now Patent No. 3,059,196 in behalf of J. J. Lentz and assigned to the assignee of the subject application.

While the invention has been particularly shown and described with reference to preferred embodiments thereof, it will be understood by those skilled in the art that various changes in form and details may be made therein without departing from the spirit and scope of the invention.

What is claimed is:

1. A superconductive in-line gating device without inductive coupling comprising; a control conductor including first and second control conductor sections; a gate conductor including first and second gate conductor sections; said first control conductor section and said first gate conductor section being laid down one above the other extending in parallel-spaced relationship to form a first in-line cryotron; said second control conductor section and said second gate conductor section being laid down one above the other extending in parallel-spaced relationship to form a second in-line cryotron; means for applying control current to said control conductor and means for applying gating current to said gate conductor; said currents being applied to flow in the same direction in said first control conductor section and said first gate conductor section forming said first in-line cryotron and in opposite directions in said second control conductor section and said second gate conductor section forming said second in-line cryotron.

2. The gating device of claim 1 wherein said second gate conductor section is fabricated of a soft superconductive material and is controlled between superconducting and resistive states by control currents applied to said control conductor; and said first in-line cryotron is a dummy cryotron and said first gate section is fabricated of a hard superconductive material and is unaffected by current signals applied to said control conductor.

3. The device of claim 1 wherein the width of said first gate conductor section is less than the width of said first control conductor section and the width of said second gate conductor section is less than the width of said second control conductor section; and each of said first and second gate conductor sections is fabricated of soft superconductive materials and is controlled between superconducting and resistive states in response to signals applied to said control conductor including said first and second control conductor sections.

4. The device of claim 1 wherein said first and second control conductor sections are connected in parallel-circuit relationship and said first and second gate conductor sections are connected in series-circuit relationship.

5. The device of claim 1 wherein said first and second control conductor sections are connected in series-circuit relationship and said first second gate conductor sections are connected in series-circuit relationship.

6. A superconductive gating device comprising; a superconductive control conductor having first and second control conductor sections; a superconductive gate conductor having first and second gate conductor sections; a superconductive shield; each of said control and gate conductor sections having a width appreciably greater than its thickness; said first control and gate conductor sections being laid down one above the other extending in parallel-spaced relationship adjacent said superconductive shield; said first control conductor section being wider than said first gate conductor section; said second control and gate conductor sections being laid down one above the other and extending in parallel-spaced relationship adjacent said superconductive shield; said second control conductor section being wider than said second gate conductor section; means for applying control current to said control conductor including said first and second control conductor sections and for applying gate current to said gate conductor including said first and second gate conductor sections; said control current and gate current flowing in the same direction in said first control conductor section and said first gate section arranged one above the other and flowing in opposite directions in said second control conductor section and said second gate conductor section arranged one above the other; each of said gate conductor sections being fabricated of a soft superconductive material and controllable between superconducting and resistive states in response to current flowing in said control conductor.

7. A superconductive in-line gating device without inductive coupling comprising; a planar superconductive shield; a planar superconductive gate conductor including first and second gate conductor sections; a planar superconductive control conductor including first and second control conductor sections; said first control conductor section and said first gate conductor section being laid down one above the other on said superconductive shield extending in parallel-spaced relationship to form a first in-line cryotron; said second control conductor section and said second gate conductor section being laid down one above the other on said superconductive shield extending in parallel-spaced relationship to form a second in-line cryotron; means for applying current to said control and gate conductors; one of said gate and control conductors having a straight line geometry and the other having a figure 8 geometry whereby current flow in said first control conductor section is in the same direction as in the first gate conductor section and current flow in the second control conductor section is in an opposite direction to the current flow in the second gate conductor section.

8. The gating device of claim 7 wherein at least one of said control conductor sections has a width greater than the width of the corresponding gate conductor section.

9. The gating device of claim 8 wherein each of said control conductor sections has a width greater than the width of the corresponding gate conductor section.

10. The gating device of claim 9 wherein each of said gate conductor sections is fabricated of soft superconductive material and is controllable between superconducting and resistive states in response to current applied to said control conductor.

11. The circuit of claim 7 wherein said first gate conductor section and said first control conductor section have the same width and said second gate conductor section and said second control conductor section have the same width; and said first in-line cryotron is a dummy cryotron in which said first gate conductor section is fabricated of a hard superconductive material and is unaffected by current applied to said control conductor.

12. A superconducting gating device comprising; a superconductive shield; a superconductive gate conductor including first and second gate sections; each of said gate sections including two planar portions laid down one above the other in bifilar fashion; a straight line superconductive control conductor laid down above said gate conductor sections of said gate conductor; means for applying gate current to said gate conductor and control current to said control conductor; said current flowing in the portion of said first gate conductor section nearer said control conductor in direction opposite of the direction to the current in the control conductor section and said current flowing in the other portion of said first gate conductor section nearer said shield in a direction opposite to the direction of the image of the control conductor current flowing in said shield; both of said portions of said first gate section being fabricated of a soft superconductive material and being controllable between superconducting and resistive states in response to current applied to said control conductor; the current flowing in said portion of said second gate section nearer said control conductor in the same direction as the current flowing in said control conductor and the current in the other portion of said second gate section nearer said shield flowing in the same direction as the image of the control conductor current flowing in said shield.

13. The device of claim 12 wherein the width of both portions of said first gating device is the same as the width of the adjacent portion of said control conductor.

14. A superconductive in-line gating device without inductive coupling comprising; a superconductive shield; a control conductor including first and second control conductor sections arranged in electrical parallel; a gate conductor including first and second gate conductor sections;

said first control conductor section and said first gate conductor section being laid down on said superconductive shield one above the other extending in parallel-spaced relationship to form a first in-line cryotron; means for applying control current to said control conductor and gate current to said gate conductor; said first gate conductor section and said second gate conductor section being laid down to extend longitudinally side by side on said superconductive shield and said first and second control conductor sections being similarly laid down above said first and said second gate conductor sections extending adjacent each other side by side above said superconductive shield so that said second control conductor section and second gate conductor section form a second in-line cryotron; the currents applied to said control and gate conductors flowing in the same direction in said first control conductor section and said first gate conductor section forming said first in-line cryotron and flowing in opposite directions in said second control conductor section and said second gate conductor section forming said second in-line cryotron.

15. The device of claim 14 wherein said first and second control conductor sections are connected in parallel and said first and second gate conductor sections are connected in series.

References Cited in the file of this patent

UNITED STATES PATENTS

| | | |
|---|---|---|
| 3,062,968 | McMahon | Nov. 6, 1962 |
| 3,093,749 | Dillingham | June 11, 1963 |
| 3,093,816 | Hunter | June 11, 1963 |

OTHER REFERENCES

IBM Technical Disclosure Bulletin, vol. 3, No. 7, December 1960, "Stored Current Bias," J. L. Anderson.

IBM Technical Disclosure Bulletin, vol. 3, No. 7, December 1960, "Current Gain Storage," by J. L. Anderson.